United States Patent
Roehnelt

(10) Patent No.: US 8,215,169 B2
(45) Date of Patent: Jul. 10, 2012

(54) USING POLE PIECES TO GUIDE MAGNETIC FLUX THROUGH A MEMS DEVICE AND METHOD OF MAKING

(75) Inventor: Ryan Roehnelt, Kenmore, WA (US)

(73) Assignee: Honeywell International Inc., Morristown, NJ (US)

( * ) Notice: Subject to any disclaimer, the term of this patent is extended or adjusted under 35 U.S.C. 154(b) by 580 days.

(21) Appl. No.: 12/412,241

(22) Filed: Mar. 26, 2009

(65) Prior Publication Data

US 2010/0244164 A1    Sep. 30, 2010

(51) Int. Cl.
*G01P 15/08* (2006.01)
(52) U.S. Cl. ..................................... 73/514.31
(58) Field of Classification Search ............... 73/514.31, 73/514.16, 514.21, 514.23, 514.29, 514.36
See application file for complete search history.

(56) References Cited

U.S. PATENT DOCUMENTS

| | | | | |
|---|---|---|---|---|
| 5,111,694 A | * | 5/1992 | Foote | 73/497 |
| 5,331,854 A | | 7/1994 | Hulsing, II | |
| 6,388,789 B1 | * | 5/2002 | Bernstein | 359/198.1 |
| 6,848,308 B2 | * | 2/2005 | Bauer et al. | 73/514.31 |
| 6,910,379 B2 | | 6/2005 | Eskridge et al. | |
| 7,069,784 B1 | | 7/2006 | Eskridge | |
| 7,191,654 B2 | * | 3/2007 | Dwyer et al. | 73/514.23 |
| 7,347,097 B2 | * | 3/2008 | Chernyak et al. | 73/514.17 |
| 7,480,983 B2 | | 1/2009 | Lo | |
| 7,926,348 B2 | * | 4/2011 | Dwyer | 73/514.23 |
| 7,997,136 B2 | * | 8/2011 | Dwyer et al. | 73/514.31 |
| 2006/0195305 A1 | | 8/2006 | LaFond | |

* cited by examiner

*Primary Examiner* — Helen C. Kwok
(74) *Attorney, Agent, or Firm* — Lowe Graham Jones PLLC

(57) ABSTRACT

Two opposing substrate layers each having one or more recesses filled with magnetic material guide the flow of flux through a coil in a MEMS device layer to provide for closed-loop operation. Flux flows from one pole piece through the coil to a second pole piece. A method of making using lithographic etching techniques is also provided.

11 Claims, 5 Drawing Sheets

USING POLE PIECES TO GUIDE MAGNETIC FLUX THROUGH A MEMS DEVICE AND METHOD OF MAKING

BACKGROUND OF THE INVENTION

A widely used Micro-Electro-Mechanical System/Sensor (MEMS) device for force detection and measurement employs a mechanical capacitive readout force accelerometer having a capacitive output proportional to the force applied. In one such accelerometer, one or more capacitors are formed on a proof mass suspended by one or more flexures. The proof mass is suspended in an instrument frame. A force applied to the proof mass along a particular axis will cause displacement of the proof mass relative to the frame. This displacement varies the capacitive output. The force applied to the proof mass is quantified by measuring a resultant change in capacitive output. Determining the applied force based on change in capacitance is known as open-loop operation.

By contrast, a closed-loop accelerometer achieves higher performance by using a feedback loop to cancel the movement of the proof mass, thus keeping the mass nearly stationary. Ideally, the capacitance output stays constant in the closed-loop accelerometer. To maintain a constant output, a proportional reaction force is generated to oppose the motion of the proof mass displaced from the neutral or zero displacement point when the proof mass is subjected to an action (external) force. Instead of using the change in capacitance to determine the action force applied to the mass, the action force is determined based on the reaction force necessary to maintain the proof mass in the neutral position. An example of a conventional (non-MEMS) closed-loop, flexure-type accelerometer is the Q-FLEX® manufactured by Honeywell International, Inc.

The reaction force applied to the proof mass can be generated using a magnetic field in combination with an electrical field. In such a device, the accuracy of the measurements outputted by the MEMS device depends on the properties of the magnetic field, in particular, the strength and uniformity of the magnetic field.

SUMMARY OF THE INVENTION

The present invention relates generally to a magnetic circuit used in a MEMS device to facilitate closed-loop operation. More specifically, the present invention relates to using precisely formed pole pieces to guide magnetic flux through a coil in a MEMS device layer.

An example system includes a first etched recess deposited with a high magnetic permeability material, a MEMS device layer containing an accelerometer including a coil and a proof mass, and a flux return. The return is also made of a high permeability material. Flux flows from the magnetic material, through the coil, and to the return.

In accordance with further aspects of the invention, a second etched recess filled with a magnetic material is positioned adjacent to the return, and flux flows through the second etched recess to the return.

In accordance with other aspects of the invention, the magnetic fill material is saturated.

In accordance with still further aspects of the invention, the width of the coil is greater than the width of the etched recess.

In accordance with yet another aspect of the invention, a magnet is positioned adjacent to the first etched recess.

In accordance with still other aspects of the invention the system is made by packaging a MEMS device between two substrates, etching opposing recesses relative to the MEMS device in each substrate, adding a high magnetic permeability material to create pole pieces, attaching a magnet to the first substrate and pole piece, and attaching a return to the second substrate and pole piece. Anisotropic and/or isotropic etching techniques may be utilized to form the recesses. Various substrate materials may also be used in combination with various etching chemicals and/or other etching parameters to form recesses having different shapes.

BRIEF DESCRIPTION OF THE DRAWINGS

The foreign aspects and many of the attendant advantages of this invention will become more readily appreciated as the same becomes better understood by reference to the following detailed description, when taken in conjunction with the accompanying drawings.

Preferred and alternative embodiments of the present invention are described in detail below with reference to the following drawings.

DETAILED DESCRIPTION OF THE INVENTION

Figure 1:
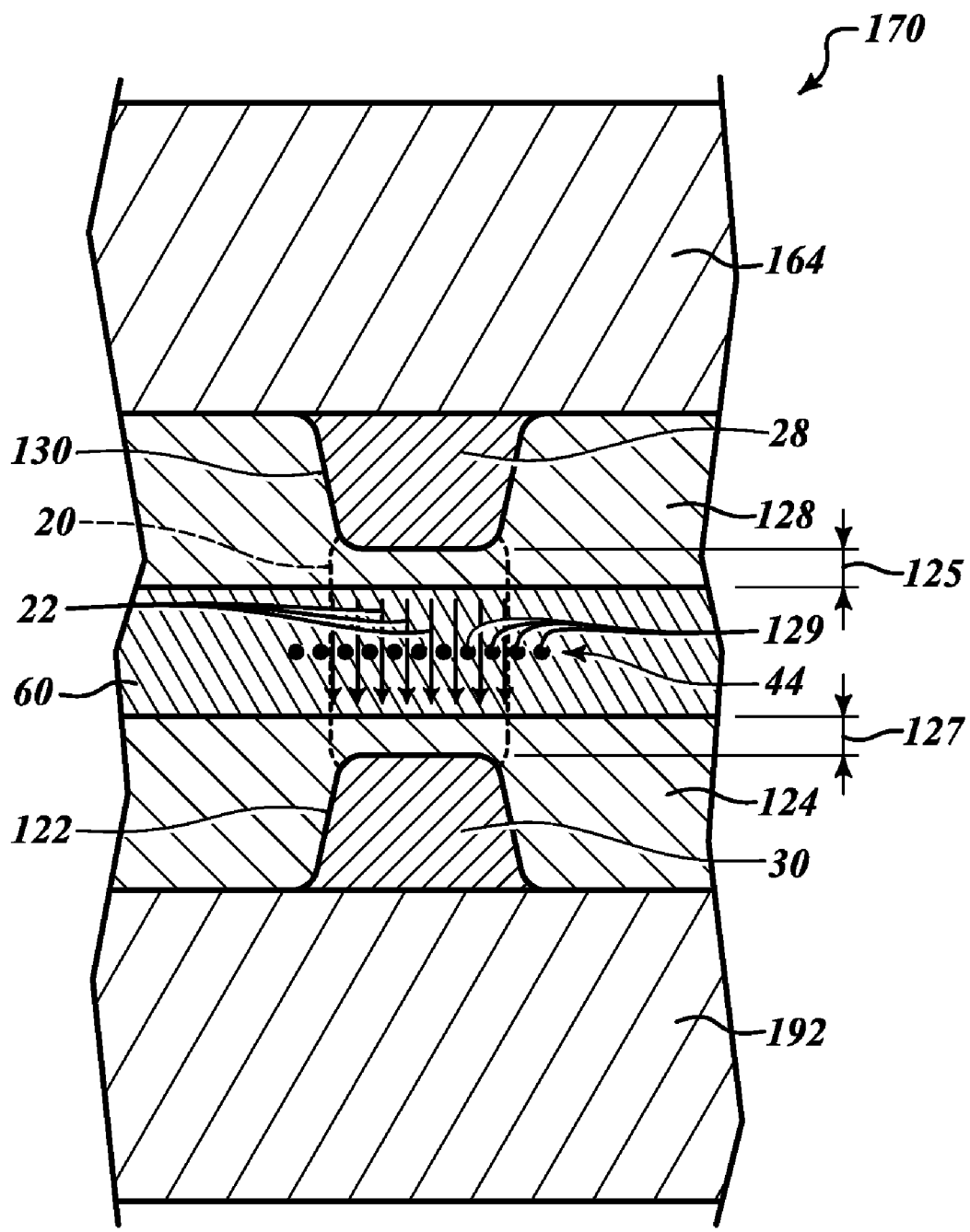
FIG. 1 is partial cross-sectional view showing a magnetic field focused across a MEMS layer formed in accordance with the current invention.

FIG. 1 is partial cross-sectional view showing a magnetic field 22 passing magnetic flux (flux) through a MEMS coil 44 created according to the principles of the current invention. The magnetic field 22 is substantially orthogonal to the coil 44. As discussed below in more detail, an electrical field (not shown) is generated by passing current through the coil 44.

The magnetic field 22 is formed by magnetic field components 170. The magnetic field components 170 include a magnet 164, a first pole piece 28, a lid 128, a second pole piece 30, and a handle 124. The magnet 164 is attached to the lid 128. The first pole piece 28 is in a first recess 130, which has been etched into the lid 128. The second pole piece 30 is in a second recess 122, which has been etched into the handle 124. The second pole piece 30 and the handle 124 are attached to a return 192. The return 192 and the pole pieces 28, 30 include a magnetically conductive material having high permeability such as, but not limited to, Alloy 39 or Kovar.

A MEMS device layer 60 is located between the handle 124 and the lid 128. The MEMS device layer 60 is made primarily of silicon. The MEMS device layer 60 also includes the coil 44. The coil 44 is made of electrically conductive material wrapped in a loop. The coil 44 contains a plurality of coil elements 129.

The pole pieces 28, 30 define a gap 20. A portion of a MEMS device layer 60 is located within the gap 20. Electrical current is provided to the coil 44 by a servo controller (not shown). The recesses 122, 130 (and pole pieces 28, 30) should be positioned so that a portion of the coil 44 containing multiple coil elements 129 resides within the gap 20.

Generally, magnetic flux flows in the path of least resistance. The handle 124 and lid 128 are made of a material having a substantially lower permeability (or higher resistance to flux) relative to the material of the pole pieces 28, 30. In one embodiment, the lid 128 and handle 124 are formed from Pyrex 7740. Based on the permeability of the handle 124 and the lid 128 relative to the permeability of the pole pieces 28, 30, flux is directed through the pole pieces 28, 30 rather than the handle 124 or lid 128.

It is desirable to pass the magnetic field 22 through the coil 44. Accordingly, the pole pieces 28, 30 are positioned relative to the handle 124, lid 128, and coil 44 to direct the magnetic field 22 through the coil 44 from the magnet 164 into the return 192. In the configuration shown in FIG. 1, a substantial magnetic flux generally flows from the magnet 164 through the first pole piece 28, the coil 44 within the MEMS layer 60, the second pole piece 30, and into the return 192.

It is also desirable that the magnetic field 22 passing through the coil 44 is uniform. To increase the flux uniformity of the magnetic field 22, the pole pieces 28, 30 may be partially or fully saturated by increasing the strength of the magnet 164 and/or decreasing the magnetic permeability of the pole pieces 28, 30.

To achieve uniform performance over temperatures the magnetic field components 170 are ideally coefficient of thermal expansion (CTE) matched to each other, subject to system/device constraints. Typically, the material of the magnet 164 and the material of the lid 128 are a poor CTE match to each other. As will be discussed in more detail below, the poor CTE match is partially mitigated by mounting the lid 128 to the center of the magnet 164.

Figure 2:
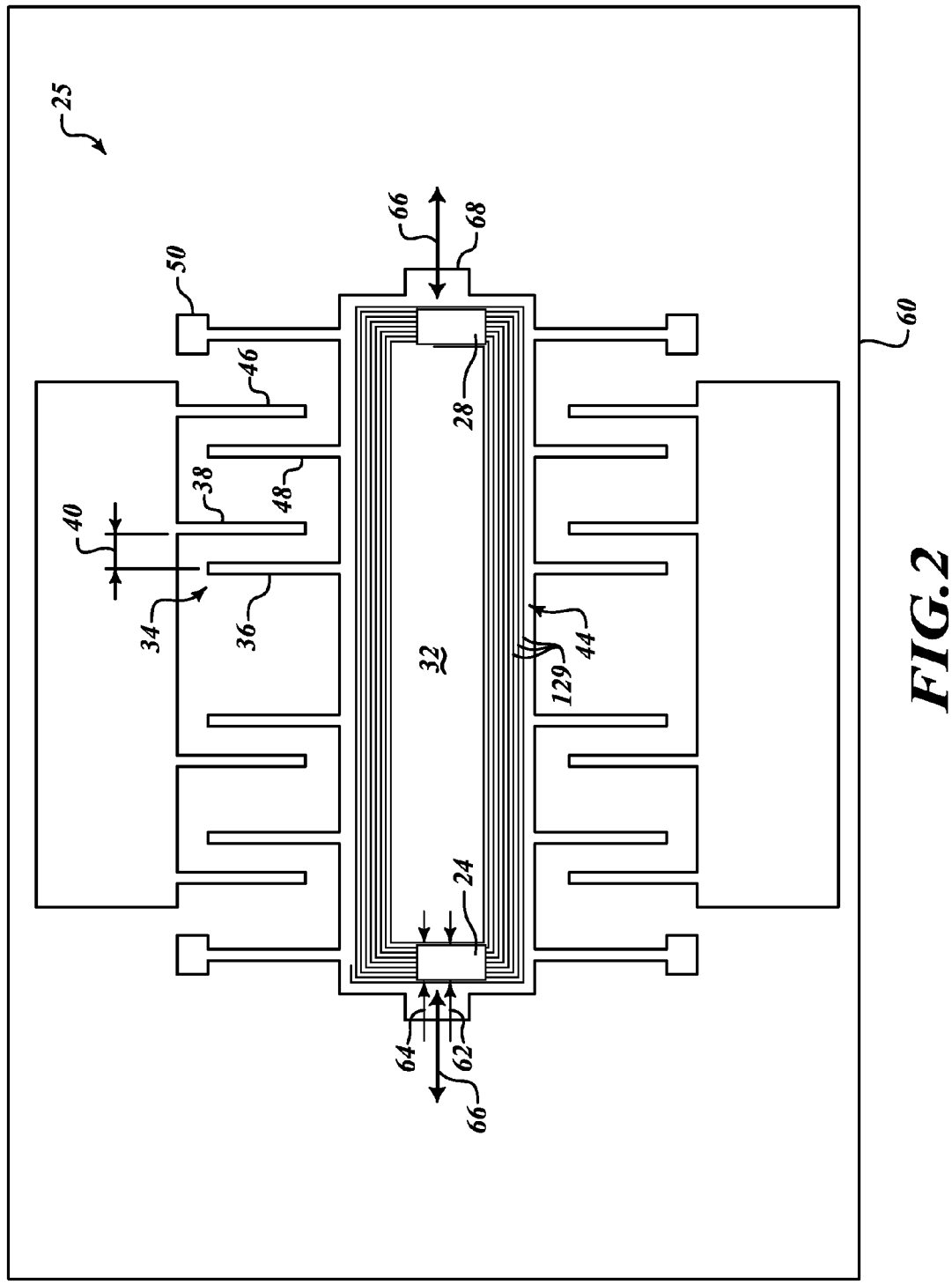
FIG. 2 is a cross-sectional view of a MEMS coil and portions of a magnetic drive formed in accordance with the current invention.

FIG. 2 shows a portion of an electrostatic comb-drive, closed-loop, in-plane, micro-machined, accelerometer 25 located in the MEMS device layer 60 of the present invention. The accelerometer 25 includes the MEMS coil 44 and the proof mass 32. MEMS coil 44 is attached to the proof mass 32. Pole pieces 24, 28 are positioned adjacent to the MEMS device layer 60 above the coil 44. The coil 44 has a width 64.

The accelerometer 25 includes two types of combs: stator combs 46 and shuttle combs 48. The shuttle combs 48 are attached to the proof mass 32. The position of the stator combs 46 is fixed, while the proof mass 32, and shuttle combs 48 may translate relative to the stator 46 by means of suspension flexure 50. The direction of translation is shown by arrows 66. The stator 46 has a first tine 38. The shuttle 48 has a second tine 36. The tines 36, 38 function as electrodes. A capacitor is formed by a capacitive gap 40 between the first tine 38 and the second tine 36. More than one capacitor can be constructed between the combs 46, 48. Translation of the stator 46 relative to the shuttle 48 changes the value of the capacitor. For a device utilizing an open-loop design, the value of the capacitor may be used to determine the active force applied in the direction of translation of the proof mass 32.

In a device utilizing a closed-loop design, the proof mass 32 is maintained in a neutral position, i.e. zero displacement by feeding back the effect of the displacement. The action (external) force applied to the proof mass 32 is determined based on the reaction force necessary to maintain the proof mass 32 in a null position.

Figure 3:
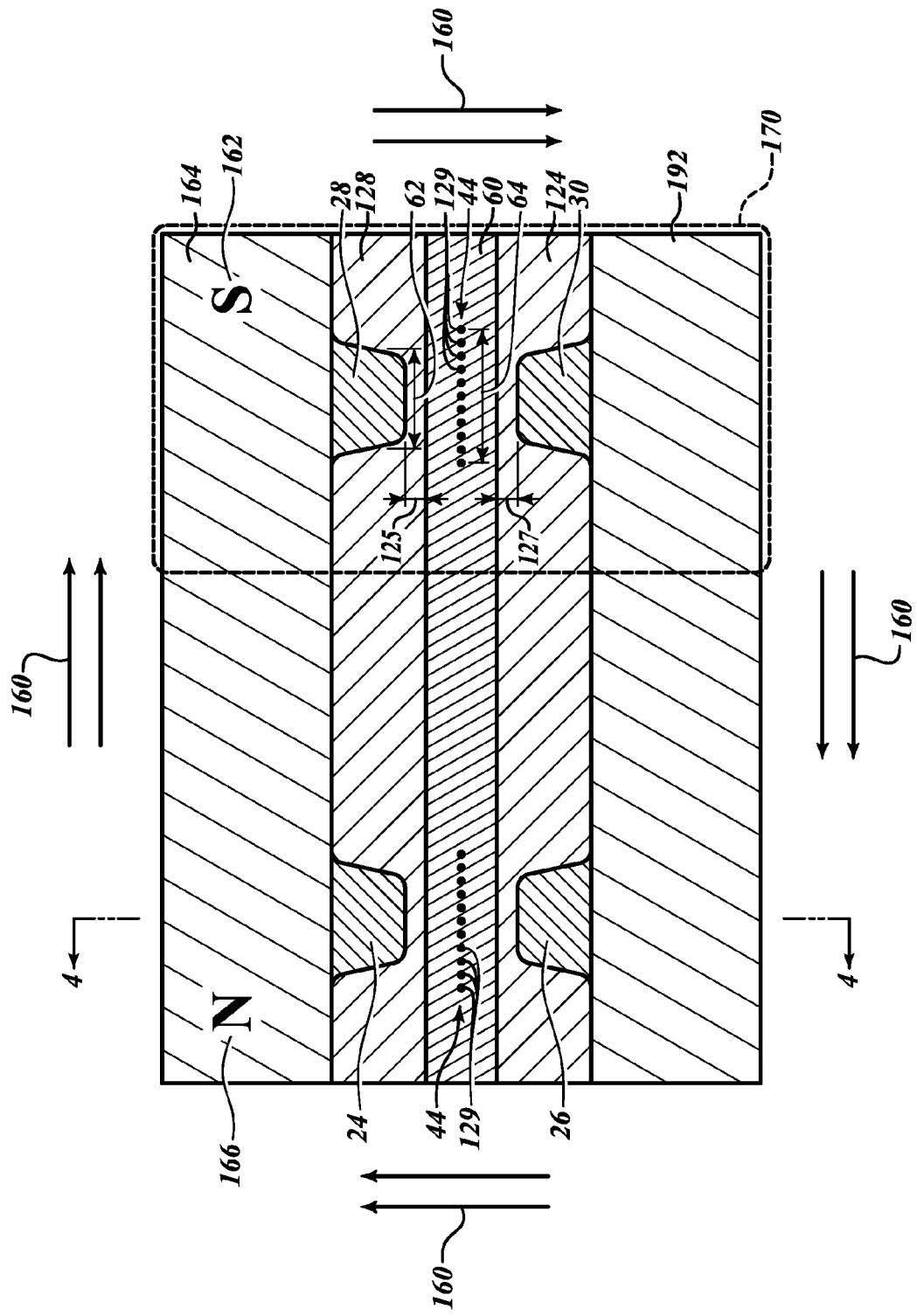
FIG. 3 is a cross-sectional view of a MEMS device layer and magnetic field components showing etched pole pieces formed in accordance with the current invention.

FIG. 3 is a view of a configuration having two pair of pole pieces 24, 26, 28, 30. Other embodiments using different numbers or placements of pole pieces are possible. However, two pair of pole pieces provides optimal performance for the cost. The pole pieces 24, 26, 28, and 30 are substantially smaller in size than the magnet 164 and/or the return 192. The pole pieces 24, 26, 28, and 30 are formed by filling the recesses that have been etched in the handle 124 and lid 128. The pole pieces 24, 26, 28, and 30 have a width 62. The magnet 164 has a south pole 162 and a north pole 166. A plurality of arrows indicates the direction of flux 160. The magnetic field 22 and the current traveling through the coil 44 generate a reaction force in opposition to any external acceleration acting on the proof mass 32. The reaction force restores the proof mass 32 to its initial position and thereby implements a closed-loop design. Specifically, the reaction force acting on the proof mass 32 is the cross product of the magnetic field 22 and the electric field vector of the current within the coil 44.

Although a closed-loop design should minimize the movement of the coil 44 and proof mass 32 in response to any external acceleration, some movement of the coil 44 and proof mass 32 may occur, typically due to vibration. Movement of the coil 44 could cause a portion of the coil 44 to be displaced outside of the gap 20 defined by the pole pieces 28, 30. Preferably, the MEMS device layer 60 is desensitized to movement of the proof mass 32 and coil 44 by configuring the width 62 of the pole pieces 28, 30 to be less than the width 64 of the coil 44. Referring to FIG. 2, if the coil 44 does translate, an identical number of coil elements 129 will still be located within the magnetic field 22 formed in the gap 20. The number of coil elements 129 being invariant allows the magnetic field 22 to interact with an E field having a substantially uniform density The uniform density in the E field allows for a substantially constant reaction force (E×B).

Figure 4:
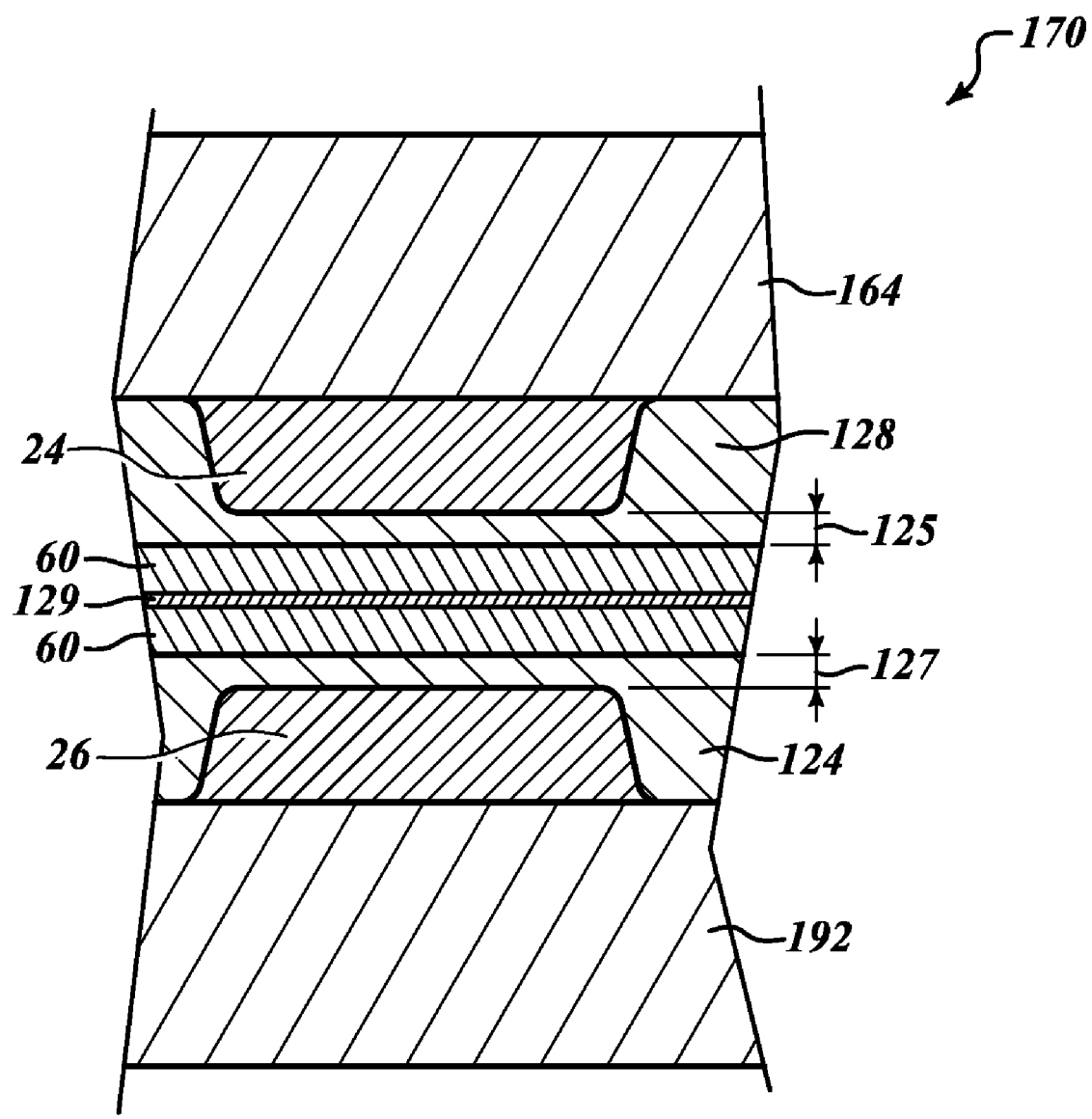
FIG. 4 is a partial cross-sectional view of the MEMS device layer and magnetic field components oriented 90 degrees from the view shown in FIG. 3.

FIG. 4 shows the components of FIG. 3 from a view that has been rotated 90° on its vertical axis. Shown are the magnetic field components 170 and one coil element 129. The coil element 129 of the coil 44 is between the lid 128 and the handle 124. The pole piece 24 and the lid 128 are attached to the magnet 164. Correspondingly, the pole piece 26 and the handle 124 are attached to the return 192.

The recesses of the foregoing invention are formed using lithographic etching. Lithographic etching provides a precisely formed, located, and relatively inexpensive means to form the recesses. To create a strong magnetic field 22 across the coil 44 the depth of recesses 130 and 122 should ideally be as close to the depth of the lid 128 or handle 124 as possible. In other words, wafer thicknesses 125 and 127 should be minimized.

Different types of lithographic etching and substrate materials may be combined to form the recesses having various dimensions. Isotropic etching is etching that proceeds in all directions at approximately the same rate, while anisotropic etching is etching that proceeds more rapidly in one direction and slower in the other direction. The type of etching chemical, type of lithographic mask, etch duration, temperature, agitation, and chemical concentration, and type of substrate are some of the factors that determine the dimensions of an etch. Accordingly, it is understood that a chemical and a substrate material may be selected by one of ordinary skill in the art to etch a recess having a desired shape and size. Magnet size, lid and handle thickness, and coil width are factors that would influence the desired size and shape of a recess.

Alternatively, dry etching or machining techniques could be used to form the recesses; however, wet etching is the most cost effective way to form the recesses with the least damage to the substrate material. Specifically, a Deep Reactive Ion Etching (DRIE) process (Bosch derived) could be used with an oxide stop module to prevent etching through a handle made of Si. Alternatively the same DRIE process, without need for the oxide stop module, could be used to etch a timed distance into a handle made of Si.

Figure 5:
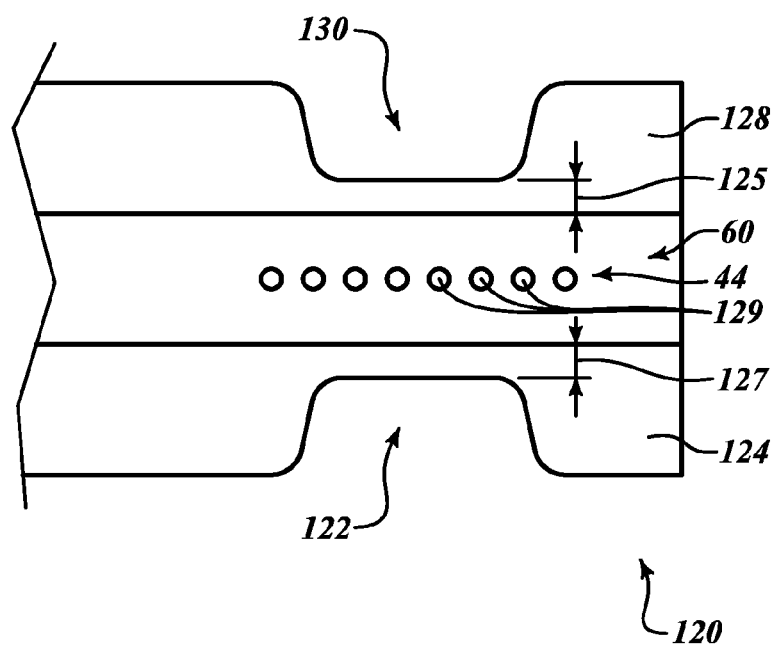
FIG. 5 is a partial cross-sectional view showing the MEMS device layer, handle, lid, and etched recesses formed in accordance with the present invention.

FIG. 5 shows a cross-sectional view of the MEMS device layer 60, the lid 128 and the handle 124. Recesses 122, 130 have been etched into the lid 128 and the handle 124 using an isotropic etching process. The lid 128 is etched to the first wafer thickness 125. The handle 124 is etched to the second wafer thickness 127. Alloy 39, Kovar, or a similar permeable magnetically conductive fill material is deposited into the recesses 122, 130 by electroplating to form pole pieces. Other techniques can be utilized to deposit the fill material into the recesses. In an exemplary embodiment, slump molding and machining can be used to form pole pieces from fill material. The pole pieces are then inserted into the recesses. After the material has been deposited into the recesses, the handle 124 and/or lid 128 is masked and plated. Alternatively, the handle 124 and/or lid 128 could be plated and then planarized. The pole pieces 24, 28 and the lid 128 are attached to the magnet 164 and the pole pieces 26, 30 are attached to the handle 124. The handle 124 and the pole pieces 26, 30 are attached to the return 192 using a compliant epoxy.

Figure 6:
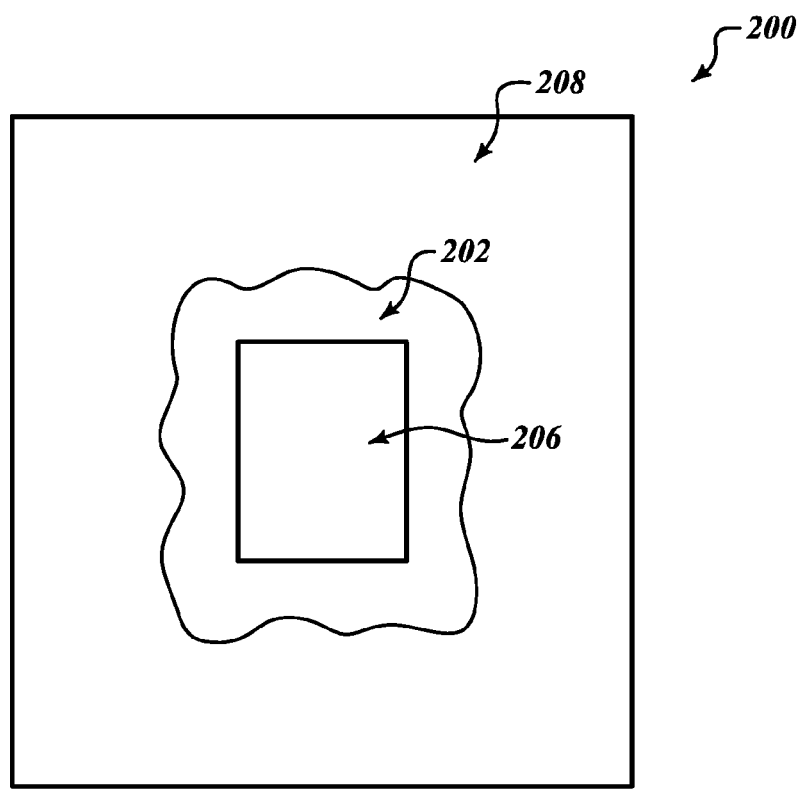
FIG. 6 is a top view of the center-mount configuration between a magnet and a lid in accordance with embodiments of the present invention.

FIG. 6 shows a detailed view of a center-mount configuration 200 for a lid or handle surface 206 relative to a return or magnet surface 208. Specifically, the lid or handle surface 206 is positioned at the approximate center of the magnet or return surface 208 in order to achieve consistent performance across temperature ranges. There is a small out-of-plane offset between the surfaces 206, 208. A compliant epoxy 202 is added to the gap to attach the return or magnet to surface 208. When the epoxy 202 cures and shrinks, the return or magnet surface 208 is pulled into hard contact with the lid or handle surface 206. The center-mount configuration 200 is especially useful when attaching the magnet 164 to the lid 128 because the magnet 164 typically does not have a CTE match to the lid 128 material. By comparison, the return 192 could be made from alloy 39, Kovar, or similar material with a good CTE match to the lid or handle surface 206 and could be bonded directly to the lid or handle surface 206 and the pole piece 30.

The various embodiments described above can be combined to provide further embodiments. U.S. Patent Application 2006/0163679 and U.S. Pat. Nos. 5,959,207, 5,763,779, and 5,111,694, are incorporated herein by reference in their entireties. Aspects can be modified, if necessary, to employ devices, features, and concepts of the various patents, applications and publications to provide yet further embodiments.

While the preferred embodiment of the invention has been illustrated and described, as noted above, many changes can be made without departing from the spirit and scope of the invention. For example, recesses having different dimensions can be used. Correspondingly, pole pieces having different dimensions can be formed. Also, a second handle could be used instead of the lid 128. Additionally, materials such as, but not limited to, silicon or Schott Borofloat could be utilized for the lid 128 or the handle 124. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for providing magnetic flux in a Micro-Electro Mechanical Systems (MEMS) device layer, the method comprising:
   receiving a substantial magnetic flux from a first magnetic material deposited in a first etched recess in a first substrate, wherein the first magnetic material directly contacts the first substrate;
   guiding the magnetic flux through a coil included within the MEMS device layer, the MEMS device layer located between the first substrate and a return; and
   passing the magnetic flux through a second magnetic material deposited in a second recess in a second substrate, wherein the second substrate is located between the MEMS device layer and the return,
   wherein the first and second substrates are different.

2. The method of claim 1, further comprising receiving the substantial magnetic flux from the first magnetic material deposited in the first etched recess and passing the substantial magnetic flux through the first magnetic material.

3. The method of claim 1,
   wherein the coil has a width and the first etched recess has a width,
   wherein the width of the coil is greater than the width of the first etched recess.

4. A system comprising:
   a first substrate having a first etched recess, the first etched recess having a width;
   a Micro-Electro Mechanical Systems (MEMS) device layer including a coil, the coil having a width;
   a magnet;
   a return; and
   a first magnetic material having direct contact with the magnet and the first substrate within the first etched recess,
   wherein the MEMS device layer is located between the first substrate and the return.

5. The system of claim 4, wherein the first magnetic material is saturated.

6. The system of claim 4, wherein the width of the coil is greater than the width of the first etched recess.

7. The system of claim 4, wherein the magnet located adjacent to the first substrate, the first substrate located between the magnet and the MEMS device layer.

8. The system of claim 7, further comprising a second substrate having a second etched recess, the second substrate located between the MEMS device layer and the return, the second etched recess having a width,
   wherein a second magnetic material is deposited in the second etched recess.

9. The system of claim 8, wherein the width of the coil is greater than the width of the second etched recess.

10. The system of claim 8,
    wherein the first substrate is attached to an approximate center of the magnet with an epoxy,
    wherein the second substrate is attached to the return with an epoxy.

11. The system of claim 8,
    wherein the first etched recess comprises an isotropic etch,
    wherein the second etched recess comprises an anisotropic etch.

* * * * *